United States Patent
Sugiyama et al.

(10) Patent No.: US 11,382,251 B2
(45) Date of Patent: Jul. 5, 2022

(54) COMPONENT MOUNTING SYSTEM, COMPONENT MOUNTING DEVICE, AND COMPONENT MOUNTING METHOD

(71) Applicant: YAMAHA HATSUDOKI KABUSHIKI KAISHA, Iwata (JP)

(72) Inventors: Kotaro Sugiyama, Iwata (JP); Kota Ito, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 7 days.

(21) Appl. No.: 17/045,089

(22) PCT Filed: Apr. 6, 2018

(86) PCT No.: PCT/JP2018/014715
§ 371 (c)(1),
(2) Date: Oct. 2, 2020

(87) PCT Pub. No.: WO2019/193746
PCT Pub. Date: Oct. 10, 2019

(65) Prior Publication Data
US 2021/0153401 A1 May 20, 2021

(51) Int. Cl.
*H05K 13/08* (2006.01)
*H05K 13/04* (2006.01)

(52) U.S. Cl.
CPC ....... *H05K 13/083* (2018.08); *H05K 13/0882* (2018.08); *H05K 13/0895* (2018.08); *H05K 13/0409* (2018.08); *H05K 13/0812* (2018.08)

(58) Field of Classification Search
CPC ........... H05K 13/0409; H05K 13/0812; H05K 13/083; H05K 13/0882; H05K 13/0895
See application file for complete search history.

(56) References Cited

U.S. PATENT DOCUMENTS

| 8,406,503 B2 * | 3/2013 | Ueda | G01N 21/956 |
| | | | 382/147 |
| 10,359,755 B2 * | 7/2019 | Iisaka | G05B 19/4063 |

(Continued)

FOREIGN PATENT DOCUMENTS

| CN | 101806858 A | 8/2010 |
| CN | 102438438 A * | 5/2012 |

(Continued)

OTHER PUBLICATIONS

An Office Action; "Notice of Reasons for Refusal", mailed by the Japanese Patent Office dated May 11, 2021, which corresponds to Japanese Patent Application No. 2020-511572 and is related to U.S. Appl. No. 17/045,089; with English language translation.

(Continued)

*Primary Examiner* — Carl J Arbes
(74) *Attorney, Agent, or Firm* — Studebaker & Brackett PC

(57) ABSTRACT

A component mounting system includes a component mounting device including a component mounting unit configured to mount a component on a substrate, and a controller, and a server configured to be communicable with the controller. The controller is configured or programmed to acquire a plurality of types of operating state changes that are likely to cause a quality defect, and to transmit, to the server, information according to the types of the operating state changes. The server is configured to provide information indicating an inspection type for the substrate based on the information according to the types of the operating state changes.

15 Claims, 6 Drawing Sheets

(56) References Cited

U.S. PATENT DOCUMENTS

| | | | | |
|---|---|---|---|---|
| 2012/0102726 A1* | 5/2012 | Kaida | ................ | H05K 13/0812 |
| | | | | 29/705 |
| 2014/0200700 A1* | 7/2014 | Kamioka | ........... | H05K 13/0817 |
| | | | | 700/110 |
| 2015/0089801 A1* | 4/2015 | Cho | ........................ | H01L 22/10 |
| | | | | 29/705 |
| 2016/0209207 A1* | 7/2016 | Kim | ..................... | G01B 11/167 |

FOREIGN PATENT DOCUMENTS

| | | | |
|---|---|---|---|
| CN | 103314657 A | | 9/2013 |
| JP | 2000-022393 A | | 1/2000 |
| JP | 2012-064831 A | | 3/2012 |
| JP | 2015-095586 A | | 5/2015 |
| JP | 2017-017049 A | | 1/2017 |
| JP | 2017017049 A | * | 1/2017 |
| JP | 2017-034142 A | | 2/2017 |
| JP | 2017-045904 A | | 3/2017 |

OTHER PUBLICATIONS

International Search Report issued in PCT/JP2018/014715; dated Jul. 3, 2018.
Written Opinion issued in PCT/JP2018/014715; dated Jul. 3, 2018.
An Office Action mailed by the China National Intellectual Property Administration dated Mar. 26, 2021, which corresponds to Chinese Patent Application No. 201880090751.3 and is related to U.S. Appl. No. 17/045,089; with English language translation.

* cited by examiner

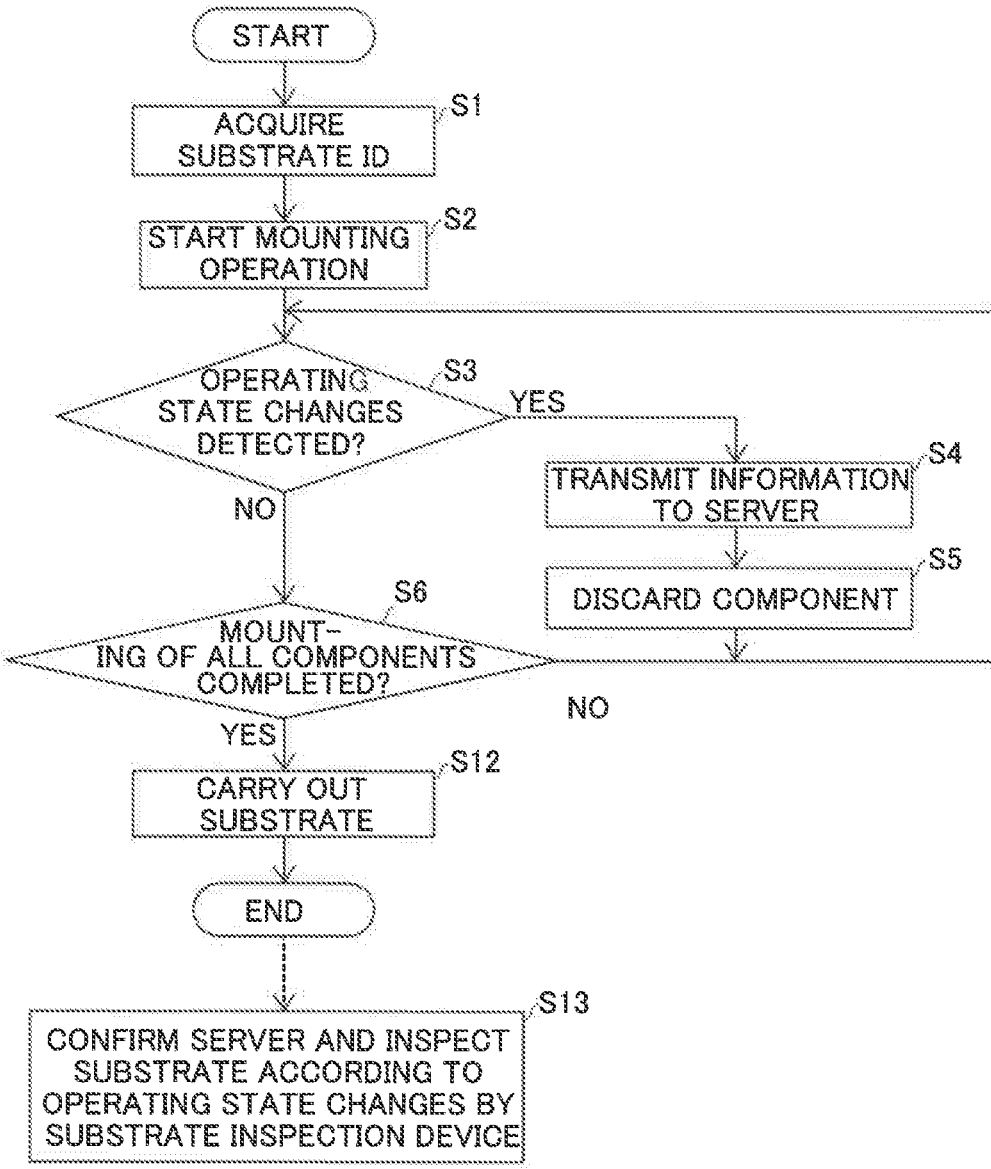

COMPONENT MOUNTING SYSTEM, COMPONENT MOUNTING DEVICE, AND COMPONENT MOUNTING METHOD

CROSS-REFERENCE TO RELATED APPLICATION

This application is a National Stage of International Patent Application No. PCT/JP2018/014715, filed Apr. 6, 2018, the entire content of which is incorporated herein by reference.

BACKGROUND

Technical Field

The present disclosure relates to a component mounting system, a component mounting device, and a component mounting method.

Background Art

Conventionally, a component mounting device is known. Such a component mounting device is disclosed in Japanese Patent Laid-Open No. 2015-095586, for example.

Japanese Patent Laid-Open No. 2015-095586 discloses a component transfer device (component mounting device) including a mounting head that mounts components on a substrate and a controller that detects a component drop during the component mounting operation. In this component transfer device, when a component drop is detected during the component mounting operation, the substrate on which the components are being mounted is set as a foreign matter inspection target substrate on which a foreign matter inspection is performed in a downstream substrate inspection device.

SUMMARY

However, in the component transfer device (component mounting device) disclosed in Japanese Patent Laid-Open No. 2015-095586, when a component drop is detected during the component mounting operation, the foreign matter inspection of the substrate can be performed, but when a situation, in which it is desirable to inspect the substrate, other than the component drop occurs, no additional inspection such as the foreign matter inspection is performed. Therefore, there is a problem that an abnormality of the substrate on which the components have been mounted may be missed.

Therefore, the present disclosure provides a component mounting system, a component mounting device, and a component mounting method capable of significantly reducing or preventing missing of an abnormality of a substrate on which components have been mounted.

A component mounting system according to a first aspect of the present disclosure includes a component mounting device including a component mounting unit configured to mount a component on a substrate, a controller, and a server configured to be communicable with the controller. The controller is configured or programmed to acquire a plurality of types of operating state changes that are likely to cause a quality defect, and to transmit, to the server, information according to the types of the operating state changes, and the server is configured to teach an inspection type for the substrate based on the information according to the types of the operating state changes.

The component mounting system according to the first aspect of the present disclosure is configured as described above such that the substrate can be inspected based on the plurality of types of operating state changes that are likely to cause a quality defect, and thus the inspection can be performed even in cases other than a component drop. Consequently, it is possible to reliably inspect the substrate, the quality of which is likely to be poor, and thus it is possible to significantly reduce or prevent missing of an abnormality of the substrate on which the component has been mounted. In addition, the inspection can be performed according to the operating state changes, and thus a required inspection can be efficiently performed, and the inspection can be accurately performed. Moreover, the substrate having a risk of quality defect can be removed as necessary, and thus it is possible to significantly reduce or prevent outflow of the substrate having a risk of quality defect from the component mounting system.

In the aforementioned component mounting system according to the first aspect, the operating state changes preferably relate to at least one of a mounting operation abnormality, a mounting operation stop, and a mounting condition change. Accordingly, the inspection can be performed based on the plurality of types of operating state changes that relate to at least one of the mounting operation abnormality, the mounting operation stop, and the mounting condition change, and thus it is possible to effectively significantly reduce or prevent missing of the abnormality of the substrate on which the component has been mounted.

In this case, the operating state changes that relate to the mounting operation abnormality preferably include a drop of the component, a mounting abnormality during mounting, and a deviation of a center of a recognized component by a threshold or more, the operating state changes that relate to the mounting operation stop preferably include an emergency stop during component mounting by a user's operation and opening of a cover of the component mounting device, and the operating state changes that relate to the mounting condition change preferably include replacement of a nozzle of the component mounting unit configured to suction the component and replacement of the component to be supplied. Accordingly, the substrate can be inspected for each of the plurality of operating state changes as described above, and thus it is possible to more effectively significantly reduce or prevent missing of the abnormality of the substrate on which the component has been mounted.

In the aforementioned component mounting system according to the first aspect, the component mounting device is preferably configured to allow a plurality of substrates to be arranged therein, and the server is preferably configured to teach a substrate to be inspected among the plurality of substrates in the component mounting device based on the information according to the types of the operating state changes. Accordingly, the number of substrates to be inspected can be changed according to the operating state changes, and thus the inspection time can be shortened as compared with a case in which all the substrates are constantly inspected.

In this case, the server is preferably configured to instruct to inspect the substrate on which mounting is being performed in a case of the operating state changes of replacement of a nozzle of the component mounting unit configured to suction the component, replacement of the component to be supplied, a mounting abnormality during mounting, a deviation of a center of a recognized component by a threshold or more, and an emergency stop during component mounting by a user's operation, and to instruct to inspect all the substrates in the component mounting device in a case of the operating state changes of a drop of the component and opening of a cover of the component mounting device. Accordingly, it is not necessary to inspect all the substrates in the case of the operating state changes of the replacement of the nozzle of the component mounting unit that suctions the component, the replacement of the component to be supplied, the mounting abnormality during mounting, the deviation of the center of the recognized component by the threshold or more, and the emergency stop during component mounting by the user's operation, and thus an increase in the inspection time can be significantly reduced or prevented. Furthermore, there is a possibility that the substrate other than the relevant substrate on which mounting is being performed in the component mounting device is also affected in the case of the operating state changes of the drop of the component and the opening of the cover of the component mounting device, and thus all the substrates are inspected such that it is possible to more reliably inspect the substrate, the quality of which is likely to be poor.

The aforementioned component mounting system according to the first aspect preferably further includes a notifier provided in the component mounting device or a device downstream of the component mounting device, the notifier being configured to announce the inspection type, and the server is preferably configured to indicate the inspection type for the substrate with the notifier based on the information according to the types of the operating state changes. Accordingly, the user can inspect the substrate according to the types of the operating state changes based on the announcement from the notifier, and thus even when a substrate inspection device is not provided, it is possible to significantly reduce or prevent missing of the abnormality of the substrate on which the component has been mounted.

In this case, the component mounting system preferably further includes a buffer conveyor configured to receive the substrate on which the component has been mounted, and the server is preferably configured to indicate the inspection type for the substrate with the notifier based on information about the operating state changes, and to instruct to stop the substrate to be inspected on the buffer conveyor. Accordingly, the user can take out the substrate to be inspected from the buffer conveyor and inspect the substrate.

The aforementioned component mounting system according to the first aspect preferably further includes a substrate inspection device arranged downstream of the component mounting device, and the server is preferably configured to teach the inspection type for the substrate to the substrate inspection device based on the information according to the types of the operating state changes. Accordingly, the substrate inspection device can inspect the substrate according to the types of the operating state changes, and thus the work burden on the user can be reduced as compared with a case in which the user inspects the substrate.

In this case, the substrate inspection device is preferably configured to perform an unusual type of substrate inspection based on the information according to the types of the operating state changes. Accordingly, it is possible to perform the unusual type of substrate inspection on the substrate, the quality of which is likely to be poor, and thus an abnormality can be easily and accurately detected by the substrate inspection by the substrate inspection device.

In the aforementioned component mounting system according to the first aspect, the component mounting device preferably includes a plurality of component mounting devices provided in series, and the server is preferably configured to teach the inspection type for the substrate to a most downstream component mounting device among the plurality of component mounting devices or a device further downstream of the most downstream component mounting device when the operating state changes are acquired in the component mounting device. Accordingly, in the component mounting system in which the plurality of component mounting devices are provided in series, even when the substrate, the quality of which is likely to be poor, occurs, the substrate is conveyed to the most downstream component mounting device. Therefore, it is not necessary to interrupt the component mounting operation on another substrate. Consequently, it is possible to significantly reduce or prevent a decrease in the work efficiency of the component mounting operation on the substrate. The term "series" refers to a state in which the plurality of component mounting devices are connected so as to sequentially mount components on the same substrate. That is, it includes a case in which the plurality of component mounting devices are arranged on a straight line, a case in which the plurality of component mounting devices are arranged on a bent line, etc.

A component mounting device according to a second aspect of the present disclosure includes a component mounting unit configured to mount a component on a substrate, and a controller, and the controller is configured or programmed to acquire a plurality of types of operating state changes that are likely to cause a quality defect, and to transmit information such that a type of substrate inspection according to the types of the operating state changes is performed.

The component mounting device according to the second aspect of the present disclosure is configured as described above such that the substrate can be inspected based on the plurality of types of operating state changes that are likely to cause a quality defect, and thus the inspection can be performed even in cases other than a component drop. Consequently, it is possible to reliably inspect the substrate, the quality of which is likely to be poor, and thus it is possible to significantly reduce or prevent missing of an abnormality of the substrate on which the component has been mounted. In addition, the inspection can be performed according to the operating state changes, and thus a required inspection can be efficiently performed, and the inspection can be accurately performed.

A component mounting method according a third aspect of the present disclosure includes mounting a component on a substrate, acquiring a plurality of types of operating state changes that are likely to cause a quality defect, and teaching an inspection type for the substrate according to the types of the operating state changes.

The component mounting method according to the third aspect of the present disclosure is configured as described above such that the substrate can be inspected based on the plurality of types of operating state changes that are likely to cause a quality defect, and thus the inspection can be performed even in cases other than a component drop. Consequently, it is possible to reliably inspect the substrate, the quality of which is likely to be poor, and thus it is possible to significantly reduce or prevent missing of an abnormality of the substrate on which the component has been mounted. In addition, the inspection can be performed according to the operating state changes, and thus a required inspection can be efficiently performed, and the inspection can be accurately performed.

According to the present disclosure, as described above, it is possible to significantly reduce or prevent missing of the abnormality of the substrate on which the components have been mounted.

BRIEF DESCRIPTION OF THE DRAWINGS

FIG. 9 is a flowchart for illustrating a mounting operation control process of a component mounting device in the component mounting system according to the second embodiment of the present disclosure.

DETAILED DESCRIPTION

Embodiments embodying the present disclosure are hereinafter described on the basis of the drawings.

First Embodiment

The structure of a component mounting system 100 according to a first embodiment of the present disclosure is now described with reference to FIGS. 1 to 6.

(Structure of Component Mounting System)

Figure 1:
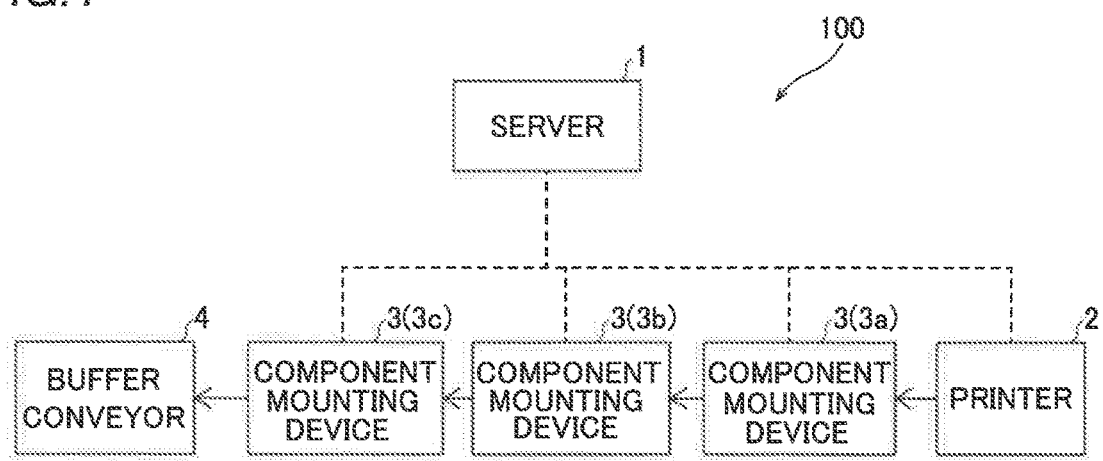
FIG. 1 is block diagram showing a component mounting system according to a first embodiment of the present disclosure.

The component mounting system 100 according to the first embodiment is configured to mount components E on a substrate S and manufacture the substrate S on which the components E have been mounted. The components E include small electronic components such as LSIs, ICs, transistors, capacitors, and resistors. As shown in FIG. 1, the component mounting system 100 includes a server 1, a printer 2, component mounting devices 3, and a buffer conveyor 4. A plurality of component mounting devices 3 (3a, 3b, and 3c) are provided downstream of the printer 2 along a substrate manufacturing line.

In the component mounting system 100, the substrate S is conveyed from the upstream side (right side) to the downstream side (left side) along the substrate manufacturing line. In addition, each device (the printer 2 and the component mounting devices 3) included in the component mounting system 100 is a self-supporting device including a controller, and the operation of each device is individually controlled by its controller. The server 1 has a role of executing a control program (production program) to control the entire component mounting system 100. In other words, the server 1 and each device transmit and receive information regarding a production plan as needed such that the substrate S on which the components E have been mounted is produced in the component mounting system 100.

The structure of each device of the component mounting system 100 is now described.

The server 1 is configured to control each device of the component mounting system 100.

The printer 2 is a screen printer and has a function of applying cream solder to a mounting surface of the substrate S. Furthermore, the printer 2 is configured to transfer the substrate S on which solder printing has been performed to the downstream component mounting device 3 (3a).

Figure 2:
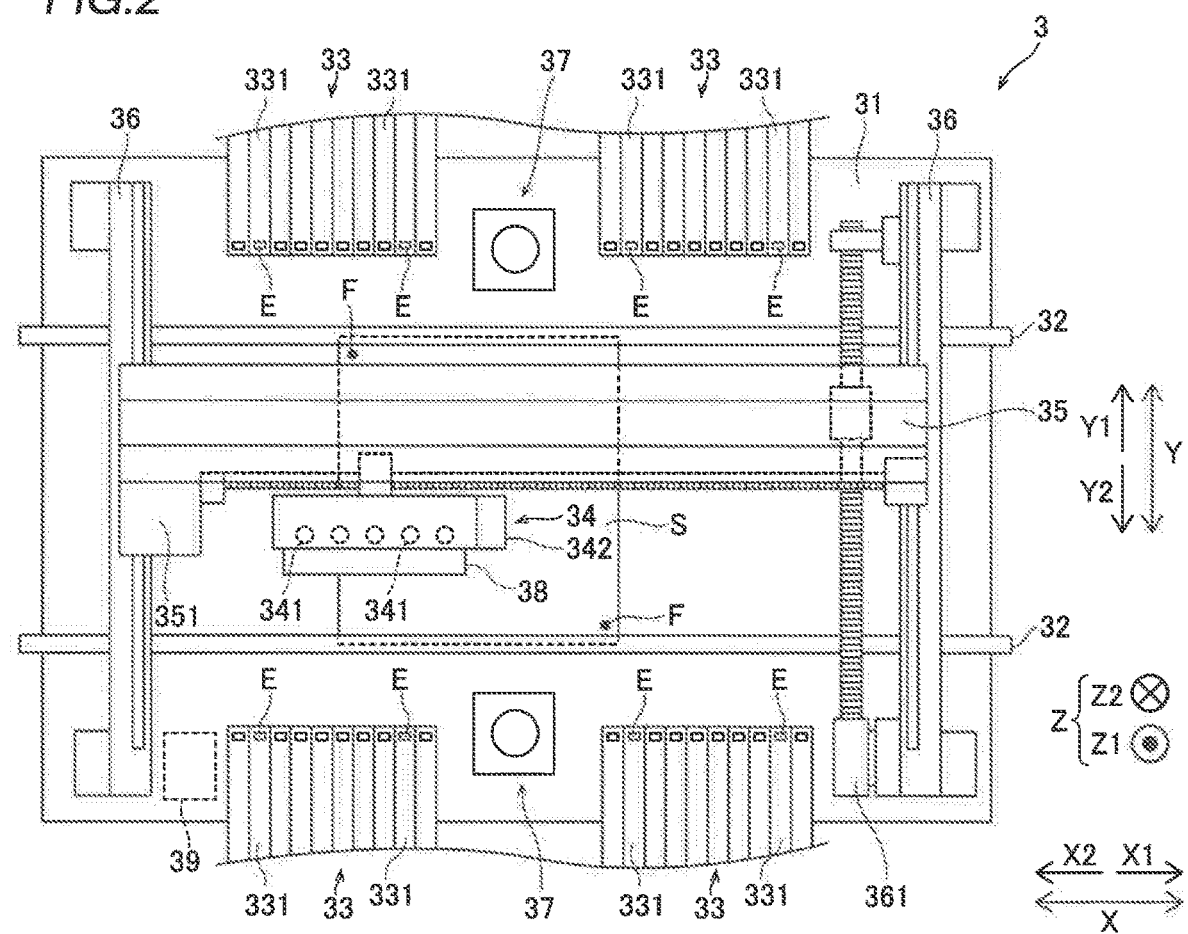
FIG. 2 is a diagram showing the overall structure of a component mounting device in the component mounting system according to the first embodiment of the present disclosure.

The component mounting devices 3 have a function of mounting the components E at predetermined mounting positions on the substrate S on which the cream solder has been printed. The plurality of component mounting devices 3 (3a to 3c) are arranged along the conveyance direction of the substrate S. The plurality of component mounting devices 3 are arranged in the order of the component mounting device 3a, the component mounting device 3b, and the component mounting device 3c from the upstream side in the conveyance direction of the substrate S. The component mounting devices 3a to 3c have the same structure. As shown in FIG. 2, the component mounting devices 3 (3a to 3c) each include a base 31, a pair of conveyors 32, component feeders 33, a head unit 34, a support 35, a pair of rails 36, component recognition imagers 37, an imaging unit 38, and a controller 39.

Figure 3:
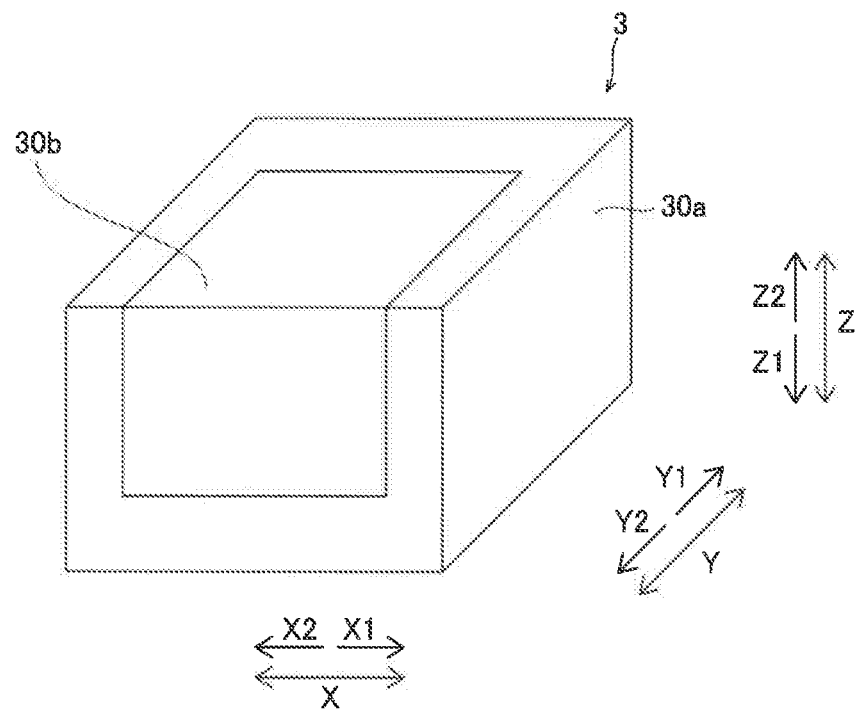
FIG. 3 is a schematic view showing the appearance of the component mounting device in the component mounting system according to the first embodiment of the present disclosure.

The component mounting devices 3 are covered with a housing 30a, as shown in FIG. 3. A cover 30b is provided on the housing 30a. The cover 30b is opened such that a user can access the inside of each of the component mounting devices 3. Furthermore, the operation of each of the component mounting devices 3 is stopped when the cover 30b is opened. That is, each of the component mounting devices 3 is configured to perform the component mounting operation with the cover 30b being closed.

Figure 4:
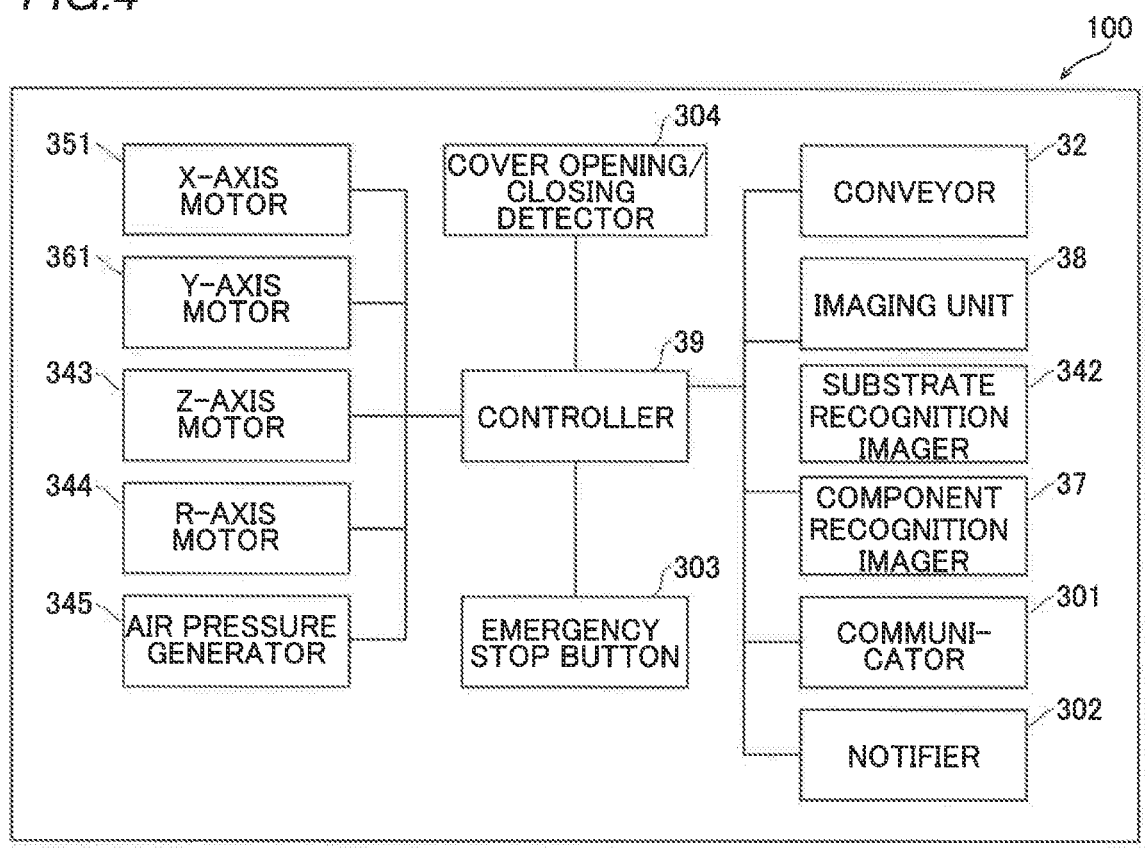
FIG. 4 is a block diagram showing the control structure of the component mounting device in the component mounting system according to the first embodiment of the present disclosure.

The component mounting devices 3 each include a communicator 301, a notifier 302, an emergency stop button 303, and a cover opening/closing detector 304, as shown in FIG. 4.

As shown in FIG. 2, the pair of conveyors 32 are installed on the base 31, and are configured to convey the substrate S in an X direction. Furthermore, the pair of conveyors 32 are configured to hold the substrate S being conveyed in a stopped state at a mounting operation position. In addition, an interval between the pair of conveyors 32 in a direction Y can be adjusted according to the dimensions of the substrate S.

The component feeders 33 are arranged outside (Y1 and Y2 sides) of the pair of conveyors 32. A plurality of tape feeders 331 are arranged in the component feeders 33.

The tape feeders 331 hold reels (not shown) on which tapes that hold a plurality of components E at a predetermined interval are wound. The tape feeders 331 are configured to supply the components E from the tips of the tape feeders 331 by rotating the reels to feed the tapes that hold the components E. When the tape that holding the components E is finished, it is replaced with the next tape (reel).

The head unit 34 is provided so as to move between above the pair of conveyors 32 and above the component feeders 33. The head unit 34 includes a plurality of (five) mounting heads 341 including nozzles 341a (see FIG. 5) attached to their lower ends and a substrate recognition imager 342. The head unit 34 includes a Z-axis motor 343 (see FIG. 4) and an R-axis motor 344 (see FIG. 4). Furthermore, an air pressure generator 345 (see FIG. 4) that generates a negative pressure and a positive pressure at the tips of the nozzles 341a of the mounting heads 341 is connected to the head unit 34 via a pipe. The mounting heads 341 are an example of a "component mounting unit" in the claims.

The mounting heads 341 are configured to mount the components E on the substrate S. Specifically, the mounting heads 341 are configured to be movable up and down (movable in a Z direction), and are configured to suction and hold the components E supplied from the tape feeders 331 by a negative pressure generated at the tips of the nozzles 341a by the air pressure generator 345 and to mount the components E at the mounting positions on the substrate S.

The substrate recognition imager 342 is configured to image fiducial marks F of the substrate S in order to recognize the position and the orientation of the substrate S. The positions of the fiducial marks F are imaged and recognized such that the mounting positions of the components E on the substrate S can be accurately acquired. The substrate recognition imager 342 is configured to image the substrate S from above (Z1 direction side).

The Z-axis motor 343 is configured to move each of the plurality of mounting heads 341 in an upward-downward direction (Z direction). The R-axis motor 344 is configured to rotate each of the mounting heads 341 about a central axis in the upward-downward direction (Z direction). The air pressure generator 345 is configured to supply a positive pressure and a negative pressure to the tips of the nozzles 341a. Due to the negative pressure generated by the air pressure generator 345, the components E are suctioned by the tips of the nozzles 341a. Furthermore, due to the positive pressure generated by the air pressure generator 345, the components E are separated from the tips of the nozzles 341a.

The support 35 includes an X-axis motor 351. The support 35 is configured to move the head unit 34 in the X direction along the support 35 by driving the X-axis motor 351. Opposite ends of the support 35 are supported by the pair of rails 36.

The pair of rails 36 are fixed on the base 31. A rail 36 on the X1 side includes a Y-axis motor 361. The rails 36 are configured to move the support 35 in the Y direction orthogonal to the X direction along the pair of rails 36 by driving the Y-axis motor 361. The head unit 34 is movable in the X direction along the support 35, and the support 35 is movable in the Y direction along the rails 36 such that the head unit 34 is movable in the X and Y directions.

The component recognition imagers 37 are fixed on the upper surface of the base 31. The component recognition imagers 37 are arranged outside (Y1 and Y2 sides) of the pair of conveyors 32. The component recognition imagers 37 are configured to image the components E suctioned by the nozzles 341a of the mounting heads 341 from below (Z2 direction side) in order to recognize the suction states (suction orientations) of the components E prior to mounting of the components E. Thus, the suction states of the components E suctioned by the nozzles 341a of the mounting heads 341 can be acquired. For example, the suction positions of the components E with respect to the nozzles 341a can be acquired by imaging by the component recognition imagers 37. Furthermore, the amounts of rotation of the components E with respect to the nozzles 341a in a horizontal plane can be acquired by imaging by the component recognition imagers 37. Accordingly, it is possible to correct the positions and the rotation of the components E based on the imaging results.

Figure 5:
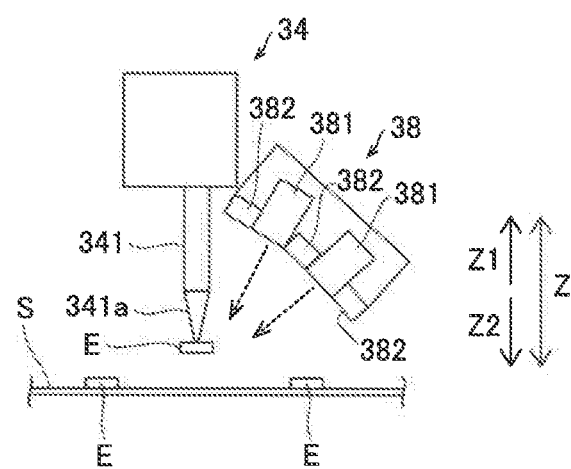
FIG. 5 is a diagram for illustrating a head unit provided in the component mounting device of the component mounting system according to the first embodiment of the present disclosure.

The imaging unit 38 is attached to the head unit 34. Thus, as the head unit 34 moves in the X and Y directions, the imaging unit 38 moves in the X and Y directions together with the head unit 34. The imaging unit 38 is configured to image the suction positions of the components E before and after suction when the components E are suctioned. As shown in FIG. 5, the imaging unit 38 is configured to image the mounting positions of the components E before and after mounting when the components E are mounted.

The imaging unit 38 is also configured to capture images for measuring the heights of the mounting positions on the substrate S. As shown in FIG. 5, the imaging unit 38 includes a plurality of cameras 381 and illuminators 382. Thus, the imaging unit 38 can image the suction positions and the mounting positions from a plurality of directions (angles). The imaging unit 38 also includes a plurality of cameras 381 of a stereo optical system. Accordingly, based on the imaging results of the imaging unit 38, three-dimensional position information about the suction positions and the mounting positions can be acquired. Furthermore, based on the images captured by the imaging unit 38 before and after suction, suction determination of the components E is performed. In addition, based on the images captured by the imaging unit 38 before and after mounting, mounting determination of the components E is performed. The suction determination and the mounting determination of the components E each are performed using a difference between the preceding and succeeding images, for example.

The illuminators 382 are configured to emit light when the cameras 381 capture images. The illuminators 382 are provided around the cameras 381. The illuminators 382 each include a light source such as an LED (light-emitting diode).

The controller 39 includes a CPU, and is configured or programmed to control the overall operation of the component mounting device 3 such as the substrate S conveying operation performed by the pair of conveyors 32, the mounting operation performed by the head unit 34, and the imaging operations performed by the component recognition imagers 37, the imaging unit 38, and the substrate recognition imager 342.

The communicator 301 is configured to be able to communicate with an external device. That is, the controller 39 can communicate with the server 1 via the communicator 301. The communicator 301 is configured to communicate with an external device by wire or wirelessly.

The notifier 302 is configured to announce the state of the component mounting device 3. The notifier 302 includes a display such as a liquid crystal display. The notifier 302 is configured to display the operating state of the component mounting device 3.

The emergency stop button 303 is a button for stopping the operation of the component mounting device 3 when the user operates the emergency stop button 303.

The cover opening/closing detector 304 is configured to detect opening/closing of the cover 30b. When the cover opening/closing detector 304 detects opening of the cover 30b, the operation of the component mounting device 3 is stopped.

Figure 6:
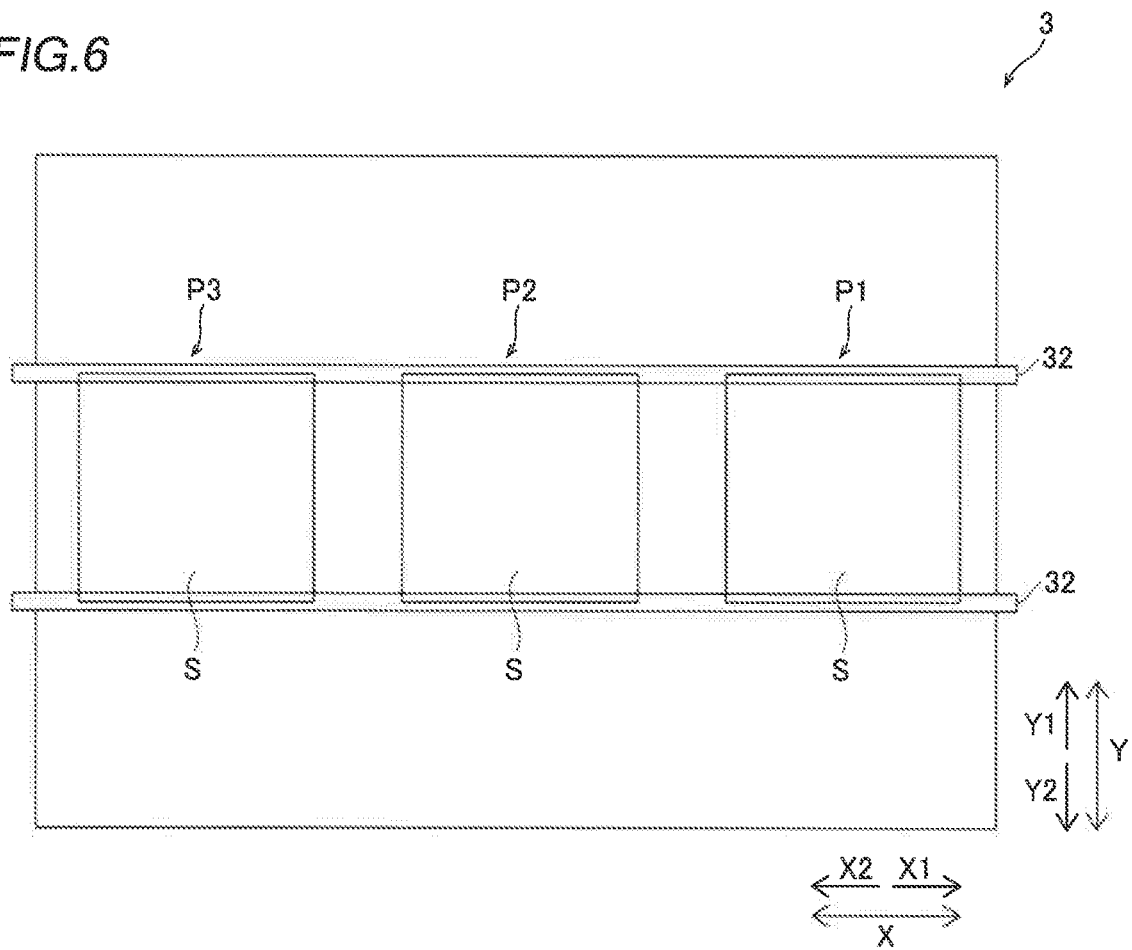
FIG. 6 is a diagram for illustrating a substrate arranged inside the component mounting device in the component mounting system according to the first embodiment of the present disclosure.

As shown in FIG. 6, inside the component mounting device 3, a plurality of substrates S can be arranged. In the component mounting device 3, the substrate S can be arranged at each of a position P1, a position P2, and a position P3, which are arranged in this order from the upstream side. In the component mounting device 3, the substrate S is carried into the position P1. Then, the substrate S is moved to the position P2. At the position P2, the components E are mounted on the substrate S. After that, the substrate S is moved to the position P3. Then, the substrate S is carried out from the position P3 to a downstream device.

As shown in FIG. 1, the buffer conveyor 4 is configured to receive the substrate S on which the components E have been mounted. Furthermore, the buffer conveyor 4 is configured to receive the substrate S from the upstream component mounting device 3 (3c) and temporarily hold the substrate S. The buffer conveyor 4 is also configured to send the substrate S to a further downstream device. The operation of the buffer conveyor 4 is controlled by the upstream component mounting device 3c.

In the first embodiment, the controller 39 of each of the component mounting devices 3 is configured or programmed to acquire a plurality of types of operating state changes that are likely to cause a quality defect. Furthermore, the controller 39 is configured or programmed to transmit information according to the types of operating state changes to the server 1.

The operating state changes relate to at least one of a mounting operation abnormality, a mounting operation stop, and a mounting condition change. Specifically, the operating state changes that relate to the mounting operation abnormality include a drop of the component E, a mounting abnormality during mounting, and a deviation of the center of the recognized component E by a threshold or more. The operating state change of the drop of the component E refers to a drop of the component E suctioned from the component feeder 33 by the mounting head 341 in the process of being conveyed to the mounting position. The drop of the component E is detected by imaging of the tip of the nozzle 341a by the imaging unit 38 immediately before component mounting. Furthermore, the drop of the component E is detected by a change in a negative pressure from the air pressure generator 345.

The operating state change of the mounting abnormality during mounting refers to a state in which the component E is not mounted at the correct mounting position on the substrate S. The mounting abnormality during mounting is detected by imaging of the mounting position of the component E by the imaging unit 38. Specifically, the mounting position of the component E is imaged by the imaging unit 38 before and after mounting, and whether or not the component E is correctly mounted is detected based on a difference between the images before and after mounting.

The operating state change of the deviation of the center of the recognized component E by the threshold or more refers to a state in which the central position of the component E suctioned by the mounting head 341 is deviated by the threshold or more. The deviation of the center of the recognized component E by the threshold or more is detected based on the imaging result of the component recognition imager 37.

The operating state changes that relate to the mounting operation stop include an emergency stop during component mounting by the user's operation and opening of the cover 30b of the component mounting device 3. The operating state change of the emergency stop during component mounting by the user's operation refers to a state in which the user has pressed the emergency stop button 303 to perform an emergency stop. The operating state change of the opening of the cover 30b of the component mounting device 3 refers to a state in which the cover 30b has been opened by the user and the mounting operation has been stopped. The opening of the cover 30b is detected by the cover opening/closing detector 304.

The operating state changes that relate to the mounting condition change include replacement of the nozzle 341a of the mounting head 341 that suctions the component E and replacement of the component E to be supplied. The operating state change of the replacement of the nozzle 341a of the mounting head 341 that suctions the component E refers to a case in which the nozzle 341a of the mounting head 341 is replaced and the component E is mounted on the first substrate S by the replaced nozzle 341a. The operating state change of the replacement of the component E to be supplied refers to a case in which the tape that holds the components E is replaced and the components E of the replaced tape are mounted on the first substrate S.

When acquiring the operating state changes that are likely to cause a quality defect, the controller 39 controls the imaging unit 38 to image the periphery of a relevant area. Moreover, the controller 39 determines an abnormality based on the imaging result. The controller 39 performs a retry depending on the abnormal state. When the abnormality is resolved by the retry, the controller 39 does not transmit information about the operating state changes to the server 1.

In the first embodiment, the server 1 is configured to teach (transmit information) an inspection type for the substrate S based on the information according to the types of operating state changes. That is, the server 1 is configured to store the operating state changes that are likely to cause a quality defect in the upstream component mounting device 3, and perform a control to stop the mounting operation and provide notification when the mounting operation is completed by the most downstream component mounting device 3.

The server 1 is configured to indicate the inspection type for the substrate S with the notifier 302 of the most downstream component mounting device 3c based on the information according to the types of operating state changes. Specifically, based on the information (teaching) from the server 1, the controller 39 of the component mounting device 3c controls the notifier 302 to display the types of operating state changes and an inspection method according to the operating state changes.

When the component E drops, a foreign substance inspection on the substrate S is performed. In the case of the mounting abnormality during mounting, the relevant mounting position and component E on the substrate S are inspected. In the case of the deviation of the center of the recognized component E by the threshold or more, the state of the component feeder 33 (the state of the tape feeder 331 and/or the state of the tape) and the state of the nozzle 341a are inspected.

In the case of the emergency stop during component mounting by the user's operation, the mounting position of the component E, which has been mounted around the time of the emergency stop, is inspected. That is, when the emergency stop is performed, it is inspected whether or not the component E in the mounting operation has been mounted. When the cover 30b of the component mounting device 3 is opened, the mounting position of the component E, which has been mounted around the time of the emergency stop of the opening of the cover 30b, is inspected. Furthermore, a foreign substance inspection on the substrate S is performed. In other words, it is also inspected whether or not a foreign substance has been mixed by opening the cover 30b.

In the case of the replacement of the nozzle 341a of the mounting head 341 that suctions the component E, the mounting result of the component E mounted by the replaced nozzle 341a is inspected. In the case of the replacement of the component E to be supplied, the mounting result of the component E supplied from the replaced tape is inspected.

The server 1 is also configured to teach a substrate(s) S to be inspected among the plurality of substrates S in the component mounting device 3 based on the information according to the types of operating state changes. Specifically, the server 1 is configured to instruct to inspect the substrate S on which mounting is being performed in the case of the operating state changes of the replacement of the nozzle 341a of the mounting head 341 that suctions the component E, the replacement of the component E to be supplied, the mounting abnormality during mounting, the deviation of the center of the recognized component E by the threshold or more, and the emergency stop during component mounting by the user's operation. That is, the server 1 transmits information (instruction) to inspect the substrate S located at the position P2 (see FIG. 6) when the operating state changes occur in the component mounting device 3 in which the operating state changes occur. The server 1 is configured to instruct to inspect all the substrates S in the component mounting device 3 in the case of the operating state changes of the drop of the component E and the opening of the cover 30b of the component mounting device 3. That is, the server 1 transmits information (instruction) to inspect the substrates S located at the positions P1, P2, and P3 (see FIG. 6) when the operating state changes occur in the component mounting device 3 in which the operating state changes occur.

The server 1 is also configured to indicate the inspection type for the substrate S with the notifier 302 based on the information about the operating state changes. Specifically, the server 1 is configured to teach (transmit information) the inspection type for the substrate S to the notifier 302 of the most downstream component mounting device 3 when the operating state changes are acquired in the component mounting device 3. The server 1 is also configured to instruct to stop the substrate S to be inspected on the buffer conveyor 4. Specifically, the server 1 transmits information (instruction) for stopping the buffer conveyor 4 to the component mounting device 3c. Then, the buffer conveyor 4 is stopped by control of the controller 39 of the component mounting device 3c.

(Description of Mounting Operation Control Process)

A mounting operation control process of the component mounting system 100 is now described with reference to FIG. 7.

The mounting operation control process in FIG. 5 is performed by the controller 39 of each component mounting device 3.

Figure 7:
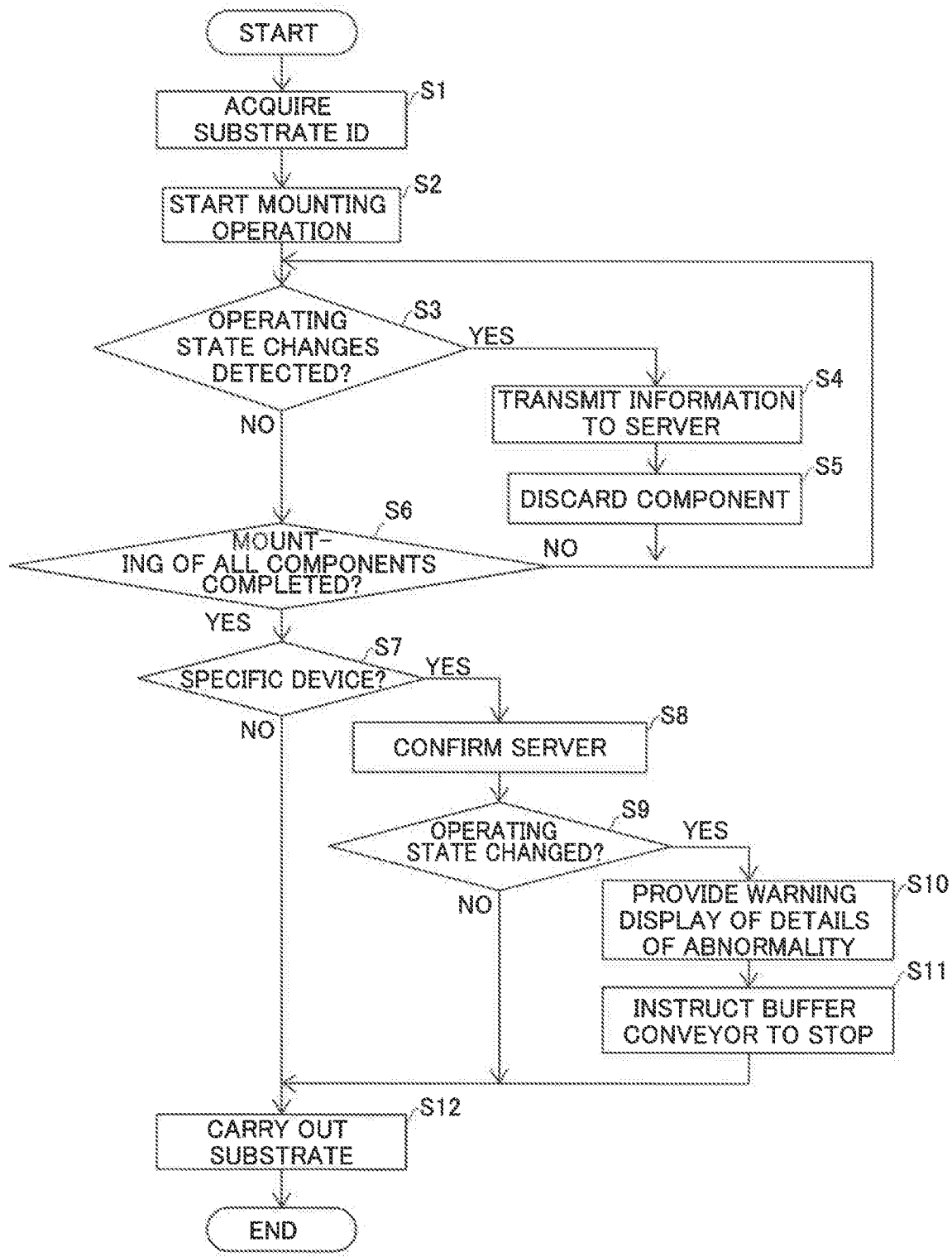
FIG. 7 is a flowchart for illustrating a mounting operation control process of the component mounting device in the component mounting system according to the first embodiment of the present disclosure.

In step S1 of FIG. 7, substrate ID is acquired. The substrate ID is acquired based on imaging by the substrate recognition imager 342. Alternatively, the substrate ID is acquired by communication from the server 1 or an upstream device. In step S2, the mounting operation is started. Specifically, the mounting heads 341 suction the components E from the component feeders 33, and mount the components E at the mounting positions on the substrate S.

In step S3, it is determined whether or not the operating state changes have been detected. When the operating state changes have been detected, the process advances to step S4. When the operating state changes have not been detected, the process advances to step S6.

In step S4, the information about the operating state changes is transmitted to the server 1. Specifically, the information about the substrate ID and the types of operating state changes are transmitted to the server 1. In step S5, the component E is discarded as necessary. For example, when the mounting head 341 is suctioning the component E and an emergency stop is performed, the suctioned component E is discarded.

In step S6, it is determined whether or not mounting of all the components E in the component mounting device 3 that is performing the mounting has been completed. That is, it is determined whether or not all the components E to be mounted have been mounted on the substrate S by the component mounting device 3. When the mounting has been completed, the process advances to step S7. When the mounting has not been completed, the process returns to step S3. In step S7, it is determined whether or not the device that makes the determination is a specific device. The specific device is a device having the buffer conveyor 4 immediately downstream thereof, a device specified by the user, or the most downstream component mounting device 3 (3c), for example. That is, the specific device is a device that has been specified to confirm (check) the operating state changes and to perform an operation according to the types of operating state changes. It is determined whether or not the device that makes the determination is the most downstream component mounting device 3. When it is the most downstream component mounting device 3 (3c), the process advances to step S8. When it is not the most downstream component mounting device 3 (3c), the process advances to step S12.

In step S8, the information about the operating state changes of the server 1 is confirmed. Specifically, communication with the server 1 is performed such that the information about the operating state changes is confirmed for the substrate S on which mounting has been completed. In step S9, it is determined whether or not there is a record of the operating state changes of the substrate S on which mounting has been completed. When there are the operating state changes, the process advances to step S10. When there is no operating state change, the process advances to step S12.

In step S10, a warning display of the details of the abnormality is provided. Specifically, based on the information (teaching) from the server 1, the notifier 302 provides a display based on the types of operating state changes. In step S11, a stop instruction is transmitted to the buffer conveyor 4. Thus, the substrate S having the information about the operating state changes is stopped on the buffer conveyor 4. In step S12, the substrate S is carried out. Then, the mounting operation control process is terminated.

Advantageous Effects of First Embodiment

According to the first embodiment, the following advantageous effects are achieved.

According to the first embodiment, as described above, the controller 39 is configured or programmed to acquire the plurality of types of operating state changes that are likely to cause a quality defect and to transmit the information according to the types of operating state changes to the server 1. Furthermore, the server 1 is configured to teach the inspection type for the substrate S based on the information according to the types of operating state changes. Accordingly, the substrate can be inspected based on the plurality of types of operating state changes that are likely to cause a quality defect, and thus the inspection can be performed even in cases other than a component drop. Consequently, it is possible to reliably inspect the substrate S, the quality of which is likely to be poor, and thus it is possible to significantly reduce or prevent missing of an abnormality of the substrate S on which the components E have been mounted. In addition, the inspection can be performed according to the operating state changes, and thus a required inspection can be efficiently performed, and the inspection can be accurately performed. Moreover, the substrate S having a risk of quality defect can be removed as necessary, and thus it is possible to significantly reduce or prevent outflow of the substrate S having a risk of quality defect from the component mounting system 100.

According to the first embodiment, as described above, the operating state changes relate to at least one of the mounting operation abnormality, the mounting operation stop, and the mounting condition change. Accordingly, the inspection can be performed based on the plurality of types of operating state changes that relate to at least one of the mounting operation abnormality, the mounting operation stop, and the mounting condition change, and thus it is possible to effectively significantly reduce or prevent missing of the abnormality of the substrate S on which the components E have been mounted.

According to the first embodiment, as described above, the operating state changes that relate to the mounting operation abnormality include the drop of the component, the mounting abnormality during mounting, and the deviation of the center of the recognized component E by the threshold or more, the operating state changes that relate to the mounting operation stop include the emergency stop during component mounting by the user's operation and the opening of the cover 30b of the component mounting device 3, and the operating state changes that relate to the mounting condition change include the replacement of the nozzle 341a of the mounting head 341 that suctions the component E and the replacement of the component E to be supplied. Accordingly, the substrate can be inspected for each of the plurality of operating state changes as described above, and thus it is possible to more effectively significantly reduce or prevent missing of the abnormality of the substrate S on which the components E have been mounted.

According to the first embodiment, as described above, the server 1 is configured to teach the substrate S to be inspected among the plurality of substrates S in the component mounting device 3 based on the information according to the types of operating state changes. Accordingly, the number of substrates S to be inspected can be changed according to the operating state changes, and thus the inspection time can be shortened as compared with a case in which all the substrates S are constantly inspected.

According to the first embodiment, as described above, the server 1 is configured to instruct to inspect the substrate S on which mounting is being performed in the case of the operating state changes of the replacement of the nozzle 341a of the mounting head 341 that suctions the component E, the replacement of the component E to be supplied, the mounting abnormality during mounting, the deviation of the center of the recognized component E by the threshold or more, and the emergency stop during component mounting by the user's operation, and to instruct to inspect all the substrates S in the component mounting device 3 in the case of the operating state changes of the drop of the component and the opening of the cover 30b of the component mounting device 3. Accordingly, it is not necessary to inspect all the substrates S in the case of the operating state changes of the replacement of the nozzle 341a of the mounting head 341 that suctions the component E, the replacement of the component E to be supplied, the mounting abnormality during mounting, the deviation of the center of the recognized component E by the threshold or more, and the emergency stop during component mounting by the user's operation, and thus an increase in the inspection time can be significantly reduced or prevented. Furthermore, there is a possibility that the substrates S other than the relevant substrate S on which mounting is being performed in the component mounting device 3 are also affected in the case of the operating state changes of the drop of the component and the opening of the cover 30b of the component mounting device 3, and thus all the substrates S are inspected such that it is possible to more reliably inspect the substrate S, the quality of which is likely to be poor.

According to the first embodiment, as described above, the component mounting device 3 includes the notifier 302 configured to announce the inspection type, and the server 1 is configured to transmit a signal for indicating the inspection type for the substrate S with the notifier 302 based on the information according to the types of operating state changes. Accordingly, the user can inspect the substrate S according to the types of operating state changes based on the announcement from the notifier 302, and thus even when a substrate inspection device is not provided, it is possible to significantly reduce or prevent missing of the abnormality of the substrate S on which the components E have been mounted.

According to the first embodiment, as described above, the server 1 is configured to transmit the signal for indicating the inspection type for the substrate S with the notifier 302 based on the information about the operating state changes and a signal for stopping the substrate S to be inspected on the buffer conveyor 4. Accordingly, the user can take out the substrate S to be inspected from the buffer conveyor 4 and inspect the substrate S.

According to the first embodiment, as described above, the plurality of component mounting devices 3 are provided in series, and the server 1 is configured to transmit a signal for teaching the inspection type for the substrate S to the most downstream component mounting device 3c when the operating state changes are acquired in the component mounting device 3. Accordingly, in the component mounting system 100 in which the plurality of component mounting devices 3 (3a to 3c) are provided in series, even when the substrate S, the quality of which is likely to be poor, occurs, the substrate S is conveyed to the most downstream component mounting device 3c. Therefore, it is not necessary to interrupt the component mounting operation on another substrate S. Consequently, it is possible to significantly reduce or prevent a decrease in the work efficiency of the component mounting operation on the substrate S.

Second Embodiment

Figure 8:
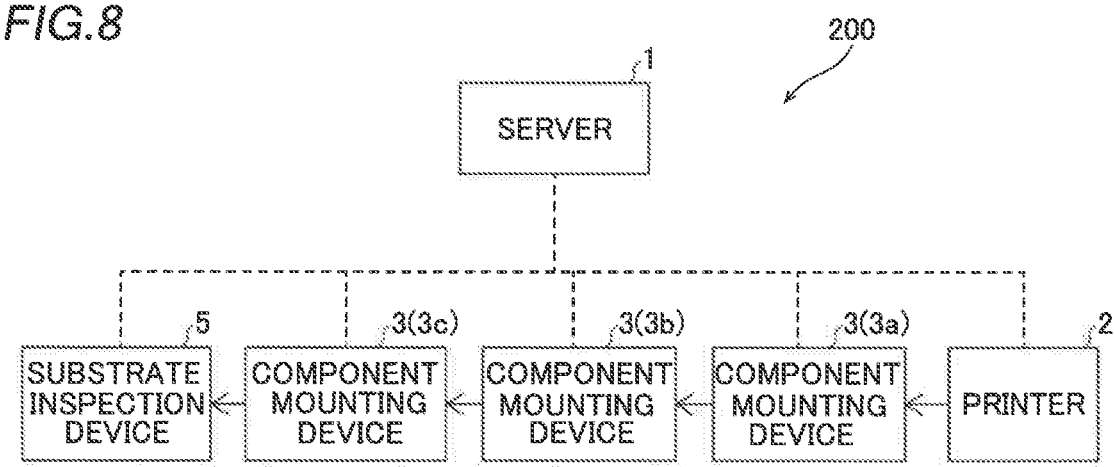
FIG. 8 is a block diagram showing a component mounting system according to a second embodiment of the present disclosure.

The structure of a component mounting system 200 according to a second embodiment of the present disclosure is now described with reference to FIG. 8. In this second embodiment, an example in which a substrate inspection device is provided downstream of the most downstream component mounting device is described unlike the first embodiment in which the buffer conveyor is provided downstream of the most downstream component mounting device.

(Structure of Component Mounting System)

The component mounting system 200 according to the second embodiment is configured to mount components E on a substrate S and manufacture the substrate S on which the components E have been mounted. As shown in FIG. 8, the component mounting system 200 includes a server 1, a printer 2, component mounting devices 3, and a substrate inspection device 5. A plurality of component mounting devices 3 (3a, 3b, and 3c) are provided downstream of the printer 2 along a substrate manufacturing line.

The substrate inspection device 5 is provided downstream of the most downstream component mounting device 3c. Furthermore, the substrate inspection device 5 has a function of inspecting the appearance of the substrate S with visible light or X-rays. The substrate inspection device 5 is configured to receive the substrate S from the upstream component mounting device 3 (3c) and inspect the substrate S. Furthermore, the substrate inspection device 5 is configured to perform an unusual type of substrate inspection based on information according to the types of operating state changes. That is, the substrate inspection device 5 is configured to inspect the substrate S having the operating state changes according to the types of operating state changes, in addition to the usual inspection.

In the second embodiment, a controller 39 of each of the component mounting devices 3 can acquire a plurality of types of operating state changes that are likely to cause a quality defect. Furthermore, the controller 39 is configured or programmed to transmit information to the server 1 such that the type of substrate inspection according to the types of operating state changes is performed.

In the second embodiment, the server 1 is configured to teach an inspection type for the substrate S based on the information according to the types of operating state changes. Specifically, the server 1 is configured to teach (transmit information) the inspection type for the substrate S to the substrate inspection device 5 based on the information according to the types of operating state changes. That is, in the second embodiment, the substrate inspection device 5 is configured to inspect the relevant substrate S when the operating state changes occur in the mounting operation.

(Description of Mounting Operation Control Process)

A mounting operation control process of the component mounting system 100 is now described with reference to FIG. 9.

The mounting operation control process in FIG. 9 is performed by the controller 39 of each component mounting device 3.

In step S1 of FIG. 9, substrate ID is acquired. In step S2, the mounting operation is started. Specifically, mounting heads 341 suction the components E from component feeders 33, and mount the components E at mounting positions on the substrate S.

In step S3, it is determined whether or not the operating state changes have been detected. When the operating state changes have been detected, the process advances to step S4. When the operating state changes have not been detected, the process advances to step S6.

In step S4, information about the operating state changes is transmitted to the server 1. In step S5, the component E is discarded as necessary.

In step S6, it is determined whether or not mounting of all the components E in the component mounting device 3 that is performing the mounting has been completed. When the mounting has been completed, the process advances to step S12. When the mounting has not been completed, the process returns to step S3. In step S12, the substrate S is carried out. Then, the mounting operation control process is terminated.

After that, when the carried-out substrate S is carried into the substrate inspection device 5, a controller of the substrate inspection device 5 performs a substrate inspection process in step S13. Specifically, the substrate inspection device 5 confirms the server 1 and confirms whether or not the substrate S to be inspected has the operating state changes. When the substrate S has the operating state changes, the substrate inspection device 5 inspects the substrate S according to the operating state changes.

The remaining structures of the second embodiment are similar to those of the first embodiment.

According to the second embodiment, the following advantageous effects are achieved.

According to the second embodiment, as described above, the controller 39 is configured or programmed to acquire the plurality of types of operating state changes that are likely to cause a quality defect and to transmit the information according to the types of operating state changes to the server 1. Furthermore, the server 1 is configured to teach the inspection type for the substrate S based on the information according to the types of operating state changes. Accordingly, it possible to significantly reduce or prevent missing of the abnormality of the substrate S on which the components E have been mounted.

According to the second embodiment, as described above, the substrate inspection device 5 is provided downstream of the component mounting devices 3. Furthermore, the server 1 is configured to teach the inspection type for the substrate S to the substrate inspection device 5 based on the information according to the types of operating state changes. Accordingly, the substrate inspection device 5 can inspect the substrate S according to the types of operating state changes, and thus the work burden on a user can be reduced as compared with a case in which the user inspects the substrate S.

According to the second embodiment, as described above, the substrate inspection device 5 is configured to perform the unusual type of substrate inspection based on the information according to the types of operating state changes. Accordingly, it is possible to perform the unusual type of substrate inspection on the substrate S, the quality of which is likely to be poor, and thus an abnormality can be easily and accurately detected by the substrate inspection by the substrate inspection device 5.

The remaining advantageous effects of the second embodiment are similar to those of the first embodiment.

Modified Examples

The embodiments disclosed this time must be considered as illustrative in all points and not restrictive. The scope of the present disclosure is not shown by the above description of the embodiments but by the scope of claims for patent, and all modifications (modified examples) within the meaning and scope equivalent to the scope of claims for patent are further included.

For example, while the example in which the notifier provided in the component mounting device is configured to announce the inspection type for the substrate according to the operating state changes based on the teaching (information) from the server has been shown in the aforementioned first embodiment, the present disclosure is not restricted to this. In the present disclosure, a notifier provided in a device further downstream of the component mounting devices may announce the inspection type for the substrate according to the operating state changes based on the teaching (information) from the server. Alternatively, another device may announce the inspection type for the substrate according to the operating state changes based on the teaching (information) from the server. For example, a terminal carried by the user may make an announcement.

While the example in which the server is configured to teach (transmit information) the inspection type for the substrate according to the operating state changes to the most downstream component mounting device among the plurality of component mounting devices has been shown in the aforementioned first embodiment, the present disclosure is not restricted to this. In the present disclosure, the server may be configured to teach (transmit information) the inspection type for the substrate according to the operating state changes to a device further downstream of the most downstream component mounting device among the plurality of component mounting devices.

While the example in which the user inspects the substrate based on the announcement of the inspection type for the substrate according to the operating state changes has been shown in the aforementioned first embodiment, the present disclosure is not restricted to this. In the present disclosure, the most downstream substrate mounting device may perform a type of substrate inspection according to the operating state changes.

While the example in which three substrates can be arranged in the component mounting device has been shown in each of the aforementioned first and second embodiments, the present disclosure is not restricted to this. In the present disclosure, two or less or four or more substrates may be able to be arranged in the component mounting device.

While the example in which the component mounting device has one mounting lane has been shown in each of the aforementioned first and second embodiments, the present disclosure is not restricted to this. In the present disclosure, the component mounting device may have a plurality of mounting lanes.

While the example in which the component mounting system includes three component mounting devices has been shown in each of the aforementioned first and second embodiments, the present disclosure is not restricted to this. In the present disclosure, the component mounting system may include two or less or four or more component mounting devices.

While the mounting operation control process is described, using the flow described in a manner driven by a flow in which processes are performed in order along a process flow for the convenience of illustration in each of the aforementioned first and second embodiments, the present disclosure is not restricted to this. In the present disclosure, the mounting operation control process may be performed in an event-driven manner in which processes are performed on an event basis. In this case, the process may be performed in a complete event-driven manner or in a combination of an event-driven manner and a manner driven by a flow.

What is claimed is:

1. A component mounting system comprising:
   a component mounting device including a component mounting unit configured to mount a component on a substrate, and a controller; and
   a server configured to be communicable with the controller; wherein
   the controller is configured or programmed to acquire a plurality of types of operating state changes that have a predetermined probability of causing a quality defect, and to transmit, to the server, information according to the types of the operating state changes; and
   the server is configured to provide information indicating an inspection type for the substrate based on the information according to the types of the operating state changes including replacement of the component to be supplied, a mounting abnormality during mounting, a deviation of a center of a recognized component by a threshold or more, or an emergency stop during component mounting by a user's operation.

2. The component mounting system according to claim 1, wherein
   the operating state changes further include at least one of a drop of the component,
   opening of a cover of the component mounting device, and
   replacement of a nozzle of the component mounting unit configured to suction the component.

3. The component mounting system according to claim 1, wherein
   the component mounting device is configured to allow a plurality of substrates to be arranged therein; and
   the server is configured to provide information indicating one of the substrates to be inspected among the plurality of substrates in the component mounting device based on the information according to the types of the operating state changes.

4. The component mounting system according to claim 3, wherein the server is configured
   to instruct to inspect the substrate on which mounting is being performed in a case of the operating state changes of: replacement of a nozzle of the component mounting unit configured to suction the component, replacement of the component to be supplied, the mounting abnormality during mounting, the deviation of the center of the recognized component by the threshold or more, or the emergency stop during component mounting by the user's operation, and
   to instruct to inspect all the substrates in the component mounting device in a case of the operating state changes of: a drop of the component or opening of a cover of the component mounting device.

5. The component mounting system according to claim 1, further comprising:
   a notifier provided in the component mounting device or a device downstream of the component mounting device, the notifier being configured to announce the inspection type; wherein
   the server is configured to indicate the inspection type for the substrate with the notifier based on the information according to the types of the operating state changes.

6. The component mounting system according to claim 5, further comprising:
   a buffer conveyor configured to receive the substrate on which the component has been mounted; wherein
   the server is configured to indicate the inspection type for the substrate with the notifier based on information about the operating state changes, and to instruct to stop the substrate to be inspected on the buffer conveyor.

7. The component mounting system according to claim 1, further comprising:
   a substrate inspection device arranged downstream of the component mounting device; wherein
   the server is configured to provide the information indicating the inspection type for the substrate to the substrate inspection device based on the information according to the types of the operating state changes.

8. The component mounting system according to claim 7, wherein the substrate inspection device is configured to perform an inspection for the substrate based on the information according to the types of the operating state changes, in addition to an other inspection for the substrate without the information according to the types of the operating state changes.

9. The component mounting system according to claim 1, wherein
the component mounting device includes a plurality of component mounting devices provided in series; and
the server is configured to provide the information indicating the inspection type for the substrate to a most downstream component mounting device among the plurality of component mounting devices or a device further downstream of the most downstream component mounting device when the operating state changes are acquired in the component mounting device.

10. The component mounting system according to claim 2, wherein
the component mounting device is configured to allow a plurality of substrates to be arranged therein; and
the server is configured to provide information indicating one of the substrates to be inspected among the plurality of substrates in the component mounting device based on the information according to the types of the operating state changes.

11. The component mounting system according to claim 2, further comprising:
a notifier provided in the component mounting device or a device downstream of the component mounting device, the notifier being configured to announce the inspection type; wherein
the server is configured to indicate the inspection type for the substrate with the notifier based on the information according to the types of the operating state changes.

12. The component mounting system according to claim 2, further comprising:
a substrate inspection device arranged downstream of the component mounting device; wherein
the server is configured to provide the information indicating the inspection type for the substrate to the substrate inspection device based on the information according to the types of the operating state changes.

13. The component mounting system according to claim 2, wherein
the component mounting device includes a plurality of component mounting devices provided in series; and
the server is configured to provide the information indicating the inspection type for the substrate to a most downstream component mounting device among the plurality of component mounting devices or a device further downstream of the most downstream component mounting device when the operating state changes are acquired in the component mounting device.

14. A component mounting device comprising:
a component mounting unit configured to mount a component on a substrate; and
a controller configured or programmed to acquire a plurality of types of operating state changes that have a predetermined probability of causing a quality defect, and to transmit information such that a type of substrate inspection according to the types of the operating state changes is performed, the types of the operating state changes including replacement of the component to be supplied, a mounting abnormality during mounting, a deviation of a center of a recognized component by a threshold or more, or an emergency stop during component mounting by a user's operation.

15. A component mounting method comprising:
mounting a component on a substrate;
acquiring a plurality of types of operating state changes that have a predetermined probability of causing a quality defect; and
providing information indicating an inspection type for the substrate according to the types of the operating state changes, the operating state changes including replacement of the component to be supplied, a mounting abnormality during mounting, a deviation of a center of a recognized component by a threshold or more, or an emergency stop during component mounting by a user's operation.

* * * * *